(12) United States Patent
Tomioka et al.

(10) Patent No.: US 11,994,892 B2
(45) Date of Patent: May 28, 2024

(54) SHUNT REGULATOR

(71) Applicant: ABLIC Inc., Tokyo (JP)

(72) Inventors: Tsutomu Tomioka, Tokyo (JP); Hideyuki Sawai, Tokyo (JP)

(73) Assignee: ABLIC Inc., Nagano (JP)

( * ) Notice: Subject to any disclaimer, the term of this patent is extended or adjusted under 35 U.S.C. 154(b) by 316 days.

(21) Appl. No.: 17/697,881

(22) Filed: Mar. 17, 2022

(65) Prior Publication Data

US 2022/0308614 A1    Sep. 29, 2022

(30) Foreign Application Priority Data

Mar. 25, 2021   (JP) .................................. 2021-050898

(51) Int. Cl.
| | | |
|---|---|---|
| *G05F 1/613* | (2006.01) | |
| *G05F 1/565* | (2006.01) | |
| *H03K 17/06* | (2006.01) | |

(52) U.S. Cl.
CPC ............... *G05F 1/613* (2013.01); *G05F 1/565* (2013.01); *H03K 17/063* (2013.01)

(58) Field of Classification Search
CPC ........ G05F 1/565; G05F 1/613; H03K 17/063
See application file for complete search history.

(56) References Cited

U.S. PATENT DOCUMENTS

| | | | | |
|---|---|---|---|---|
| 6,586,917 B1* | 7/2003 | Smith | ..................... | G05F 1/565 |
| | | | | 323/280 |
| 8,085,006 B2 | 12/2011 | Burger-Riccio et al. | | |
| 10,678,282 B1* | 6/2020 | Pannizzo | ................. | G05F 1/573 |
| 2005/0099224 A1* | 5/2005 | Itoh | .......................... | G05F 1/565 |
| | | | | 327/541 |
| 2009/0128106 A1* | 5/2009 | Takahashi | ............... | G05F 1/575 |
| | | | | 323/277 |

* cited by examiner

*Primary Examiner* — Gary L Laxton
*Assistant Examiner* — Lakaisha Jackson
(74) *Attorney, Agent, or Firm* — JCIPRNET

(57) ABSTRACT

Provided is a shunt regulator including: multiple resistors, connected in series between an output terminal and a ground terminal and constituting a voltage divider circuit; an output transistor, connected between the output terminal and the ground terminal; a first drive circuit, including a first reference voltage circuit which outputs a first reference voltage and an error amplifier, and controlling the output transistor based on a voltage of a first output terminal of the voltage divider circuit; a second drive circuit, controlling the output transistor based on a voltage of a second output terminal of the voltage divider circuit; and an activation control circuit, switching operation of the first drive circuit and the second drive circuit based on the first reference voltage. The second drive circuit has a shorter activation time than the first drive circuit.

6 Claims, 3 Drawing Sheets ary of the above-mentioned patent application is hereby
SHUNT REGULATOR

CROSS-REFERENCE TO RELATED APPLICATIONS

This application claims the priority benefit of Japan Application No. 2021-050898, filed on Mar. 25, 2021. The entirety of the above-mentioned patent application is hereby incorporated by reference herein and made a part of this specification.

BACKGROUND

Technical Field

The present invention relates to a shunt regulator, and particularly to stable operation at a low voltage.

Related Art

FIG. 4 is a circuit diagram illustrating a conventional shunt regulator.

The shunt regulator of FIG. 4 includes a reference voltage circuit 101, an error amplifier 102, an N-channel metal-oxide semiconductor (NMOS) transistor 103, and voltage divider resistors R1 and R2.

When the shunt regulator receives a power supply voltage Vin, by an output voltage Vout generated by a current flowing through an external resistor 110, a load 111 is driven. If the current flowing through the external resistor 110 having a resistance value R is Ir, the current flowing through the load 111 is Io, and the current flowing through the shunt regulator IC is Ic, then the output voltage Vout is expressed by the following equation.

$$Vout=Vin-Ir/R=Vin-(Io+Ic)/R$$

In the shunt regulator, the NMOS transistor 103 adjusts the current Ic and obtains the desired output voltage Vout. That is, in the shunt regulator, a large amount of current is consumed since the current Io always flows to the load 111 and the current Ic always flows through the shunt regulator IC. However, since the power supply voltage Vin is received via the external resistor 110, no limitation is put on the power supply voltage Vin and the power supply voltage Vin is not influenced by any changes. Further, the shunt regulator is characterized by high accuracy of the output voltage Vout.

Thus, the shunt regulator is used in applications where the output current Io may be small but the accuracy of the output voltage Vout is required.

However, in the above-mentioned shunt regulator, since an operating voltage of the circuit is based on the output voltage Vout, when the output voltage Vout decreases, a reference voltage output by the reference voltage circuit 101 also decreases. Thus, there is a problem that the time until the output voltage Vout reaches a desired value increases.

SUMMARY

The present invention provides a shunt regulator in which the time required for a low output voltage to reach a desired value can be shortened.

A shunt regulator of an aspect of the present invention includes: an output terminal, connected to a power supply terminal via an external resistor; multiple resistors, connected in series between the output terminal and a ground terminal and constituting a voltage divider circuit; an output transistor, connected between the output terminal and the ground terminal; a first drive circuit, including a first reference voltage circuit which outputs a first reference voltage and an error amplifier, and controlling the output transistor based on a voltage of a first output terminal of the voltage divider circuit; a second drive circuit, controlling the output transistor based on a voltage of a second output terminal of the voltage divider circuit; and an activation control circuit, switching operation of the first drive circuit and the second drive circuit based on the first reference voltage. The second drive circuit has a shorter activation time than the first drive circuit.

According to the shunt regulator or of the present invention, since there are provided the first drive circuit and the second drive circuit which control the output transistor as well as the activation control circuit which switches the operation of the first drive circuit and the second drive circuit, it is possible to shorten the time required for a low output voltage to reach a desired value.

DESCRIPTION OF THE EMBODIMENTS

Hereinafter, a shunt regulator of the present invention will be described with reference to the drawings.

Figure 1:
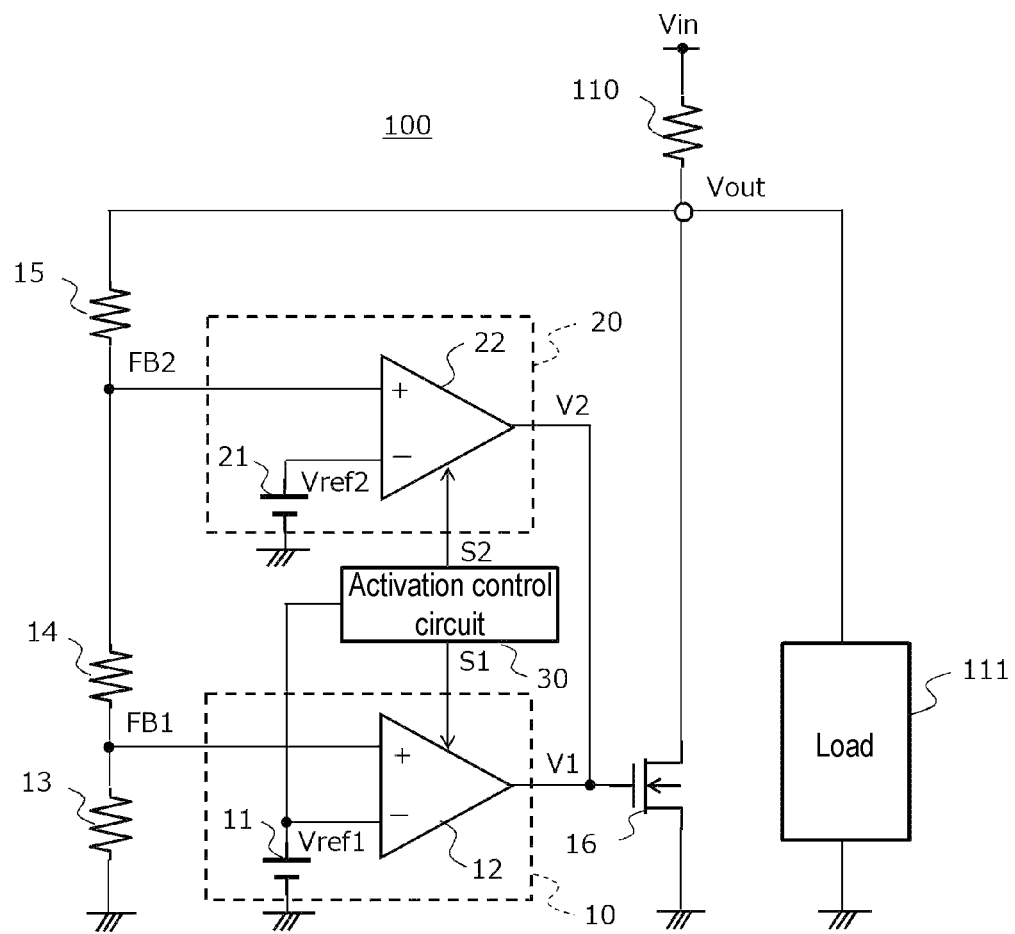
FIG. 1 is a block diagram illustrating a shunt regulator of the present embodiment.

FIG. 1 is a block diagram illustrating a shunt regulator 100 of the present embodiment.

The shunt regulator 100 of FIG. 1 includes a first reference voltage circuit 11, a first error amplifier 12, resistors 13, 14 and 15 which constitute a voltage divider circuit, an NMOS transistor 16, a second reference voltage circuit 21, a second error amplifier 22, and an activation control circuit 30. The first reference voltage circuit 11 and the first error amplifier 12 constitute a first drive circuit 10. The second reference voltage circuit 21 and the second error amplifier 22 constitute a second drive circuit 20.

The resistors 13, 14 and 15 are connected in series between an output terminal and a ground terminal. An output terminal of the first reference voltage circuit 11 is connected to an inverting input terminal (indicated by "−" in the drawings) of the first error amplifier 12, a first output terminal FB1 (connection point of the resistors 13 and 14) of the voltage divider circuit is connected to a non-inverting input terminal (indicated by "+" in the drawings) of the first error amplifier 12, and an output terminal of the first error amplifier 12 is connected to a gate of the NMOS transistor 16. An output terminal of the second reference voltage circuit 21 is connected to an inverting input terminal ("−") of the second error amplifier 22, a second output terminal FB2 (connection point of the resistors 14 and 15) of the voltage divider circuit is connected to a non-inverting input terminal ("+") of the second error amplifier 22, and an output terminal of the second error amplifier 22 is connected to the gate of the NMOS transistor 16. The output terminal of the first reference voltage circuit 11 is connected to an input terminal of the activation control circuit 30, a first output terminal S1 of the activation control circuit 30 is connected to a control terminal of the first error amplifier 12, and a second output terminal S2 of the activation control circuit 30 is connected to a control terminal of the second error amplifier 22.

Since the first drive circuit 10 operates in a normal state, it is required to operate with high accuracy and stability. Thus, for example, a low-pass filter is provided in the first reference voltage circuit 11, and the circuit has a relatively long activation time. Here, since the second drive circuit 20 operates when the shunt regulator is activated or when an output voltage Vout is low, accuracy and stability are not of importance and the circuit activation time is relatively short compared with the first drive circuit 10. A minimum operating voltage of the second reference voltage circuit 21 is set lower than a minimum operating voltage of the first reference voltage circuit 11. Further, the output voltage Vout by the second drive circuit 20 is set at least higher than the minimum operating voltage of the first reference voltage circuit 11.

Figure 2:
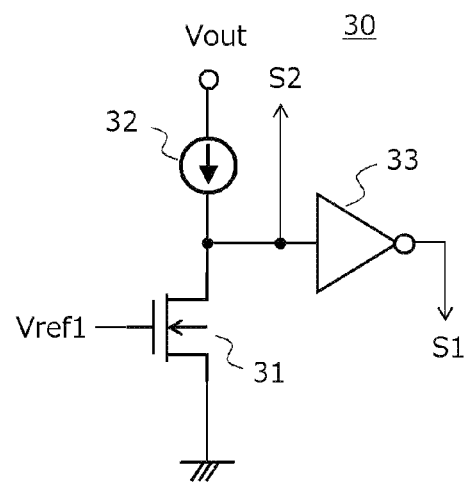
FIG. 2 is a circuit diagram illustrating an example of an activation control circuit of the present embodiment.

FIG. 2 is a circuit diagram illustrating an example of the activation control circuit 30 of the present embodiment.

The activation control circuit 30 includes an NMOS transistor 31, a constant current circuit 32, and an inverting circuit 33. The activation control circuit 30 outputs a control signal by a comparison between a drain current of the NMOS transistor 31 and a current of the constant current circuit 32.

A source of the NMOS transistor 31 is connected to a ground terminal, a gate of the NMOS transistor 31 is connected to an input terminal of the activation control circuit 30, and a drain of the NMOS transistor 31 is connected to the second output terminal S2. The constant current circuit 32 has one terminal connected to an output terminal of a shunt regulator and the other terminal connected to the second output terminal S2. An input terminal of the inverting circuit 33 is connected to the second output terminal S2, and an output terminal of the inverting circuit 33 is connected to the first output terminal S1.

The shunt regulator 100 configured as described above operates as follows.

When the shunt regulator 100 receives a power supply voltage Vin, a current flows through an external resistor 110, and the output voltage Vout is output to the output terminal. The output voltage Vout gradually increases from a value equal to or lower than the minimum operating voltage of the first reference voltage circuit 11 as electric charge is charged to a capacitor of a load 111 connected to the output terminal or an internal capacitor of the shunt regulator 100. At this time, the first reference voltage circuit 11 outputs a voltage lower than a predetermined reference voltage Vref1, and the voltage gradually increases as the output voltage Vout increases. In the NMOS transistor 31 of the activation control circuit 30, the drain current gradually increases as the voltage of the gate which receives the reference voltage Vref1 increases.

When the drain current of the NMOS transistor 31 is less than the current of the constant current circuit 32, the activation control signal 30 outputs the control signal at a Hi level to the second output terminal S2 and the control signal at a Lo level to the first output terminal S1. That is, when the output voltage Vout is low and the reference voltage Vref1 is low, such as at the time of activation, the second drive circuit 20 is operated by the control signal at a Hi level, and the first drive circuit 10 is stopped by the control signal at a Lo level.

Here, in the first drive circuit 10 and the second drive circuit 20, operation is controlled by, for example, on and off of an operating current of an error amplifier, or on and off of a switch provided at an output terminal. The output of the drive circuit which is stopped is designed to be high impedance.

A gate voltage of the NMOS transistor 16 is controlled by an output voltage V2 of the second drive circuit 20 which has a relatively short activation time. The output voltage Vout can be rapidly increased to the minimum operating voltage of the first reference voltage circuit 11 or higher by the second drive circuit 20.

When the first reference voltage circuit 11 outputs the predetermined reference voltage Vref1, the drain current of the NMOS transistor 31 becomes larger than the current of the constant current circuit 32, and the activation control signal 30 outputs the control signal at a Lo level to the second output terminal S2 and the control signal at a Hi level to the first output terminal S1. That is, the first drive circuit 10 is operated by the control signal at a Hi level, and the second drive circuit 20 is stopped by the control signal at a Lo level. Thus, in the shunt regulator 100, by operation of the NMOS transistor 16 at an output voltage V1 of the first drive circuit 10, the output voltage Vout is stabilized and the shunt regulator 100 shifts to normal operation having high accuracy. Here, the gate voltage of the NMOS transistor 31 in which the signals of the first output terminal S1 and the second output terminal S2 are inverted is a voltage at which the reference voltage Vref1 is lower than a predetermined voltage and the first reference voltage circuit 11 can be regarded as operating sufficiently stably.

As described above, in the shunt regulator 100 of the present embodiment, since there are provided the second drive circuit 20 which has a relatively short circuit activation time while being inferior in accuracy or stability to the first drive circuit 10, and the activation control circuit 30 which switches between the first drive circuit 10 and the second drive circuit 20, when the output voltage Vout is low, such as when the power is turned on, a rapid and stable shift to normal operation having high accuracy is possible.

Figure 3:
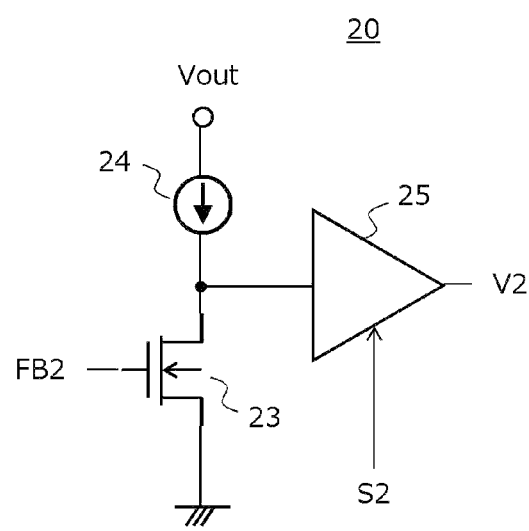
FIG. 3 is a circuit diagram illustrating another example of a second drive circuit of the present embodiment.
Figure 4:
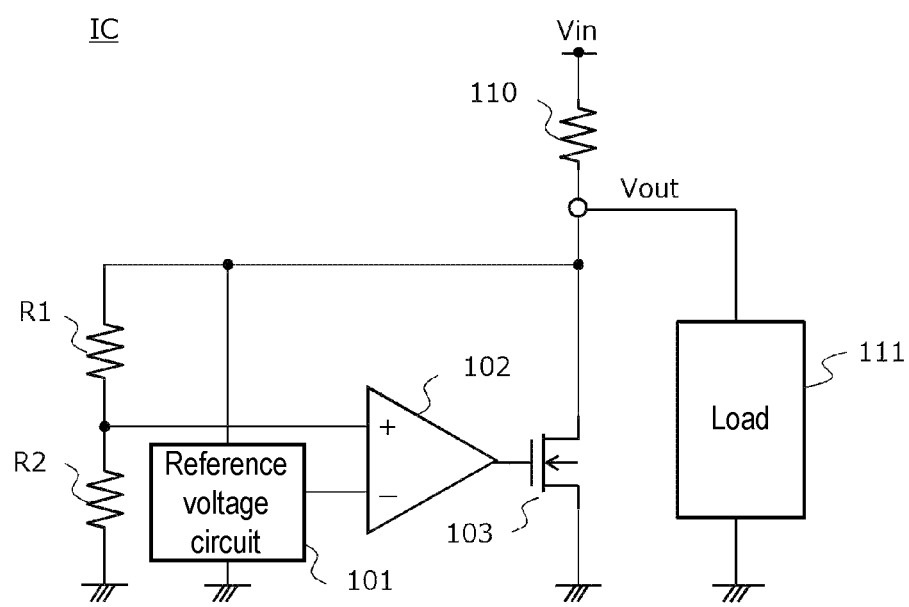
FIG. 4 is a block diagram illustrating a conventional shunt regulator.

FIG. 3 is a circuit diagram illustrating another example of the second drive circuit 20 of the present embodiment.

The second drive circuit 20 includes an NMOS transistor 23, a constant current circuit 24, and an inverting amplifier circuit 25. The inverting amplifier circuit 25 is, for example, a source grounded amplifier circuit.

A source of the NMOS transistor 23 is connected to a ground terminal, a gate of the NMOS transistor 23 is connected to the second output terminal FB2 of the voltage divider circuit, and a drain of the NMOS transistor 23 is connected to an input terminal of the inverting amplifier circuit 25. The constant current circuit 24 has one terminal connected to an output terminal of a shunt regulator and the other terminal connected to the input terminal of the inverting amplifier circuit 25. A control terminal of the inverting amplifier circuit 25 is connected to the second output terminal S2, and an output terminal of the inverting amplifier circuit 25 is connected to the output terminal of the second drive circuit 20.

In the second drive circuit 20 of FIG. 3, the voltage of the second output terminal FB2 of the voltage divider circuit received by the gate is controlled so that a drain current of the NMOS transistor 23 becomes equal to a current of the constant current circuit 24. In order for the voltage of the second output terminal FB2 of the voltage divider circuit at this time to be equal to a reference voltage Vref2 of FIG. 1, the current of the constant current circuit 24 or the size of the NMOS transistor 23 is adjusted.

Similarly to FIG. 1, in the second drive circuit 20 of FIG. 3, operation is controlled by on and off of an operating current, or on and off of a switch provided at an output terminal. The output in a stop state is designed to be high impedance.

Compared to the second drive circuit 20 of FIG. 1, the second drive circuit 20 of FIG. 3 does not include the second error amplifier 22 and the second reference voltage circuit 21. However, since the function that the circuit activation time is relatively short is satisfied while being inferior in accuracy or stability to the first drive circuit 10, the second drive circuit 20 of FIG. 3 is able to achieve the same effects as the second drive circuit 20 of FIG. 1.

Although the embodiments of the present invention have been described above, the present invention is not limited to the above embodiments, and various changes can be made without departing from the spirit of the present invention. For example, in the activation control circuit 30 illustrated in FIG. 2, since it is sufficient that the control signal can be output based on the reference voltage Vref1 of the first reference voltage circuit 11, the circuit is not limited to the activation control circuit 30 if the functions are satisfied. Also, for example, it has been described that the first drive circuit 10 and the second drive circuit 20 are operated by the control signal at a Hi level and stopped by the control signal at a Lo level. However, the logic can be freely designed. For example, the control signals output from the activation control circuit 30 may be interchanged or may be the same signal. In the case where the control signals of the activation control circuit 30 are the same signal, the inverting circuit 33 may be omitted.

What is claimed is:

1. A shunt regulator, comprising:
   an output terminal, connected to a power supply terminal via an external resistor;
   a plurality of resistors, connected in series between the output terminal and a ground terminal and constituting a voltage divider circuit;
   an output transistor, connected between the output terminal and the ground terminal;
   a first drive circuit, comprising a first reference voltage circuit which outputs a first reference voltage and a first error amplifier, and controlling the output transistor based on a voltage of a first output terminal of the voltage divider circuit;
   a second drive circuit, controlling the output transistor based on a voltage of a second output terminal of the voltage divider circuit; and
   an activation control circuit, switching operation of the first drive circuit and the second drive circuit based on the first reference voltage, wherein
   the second drive circuit has a shorter activation time than the first drive circuit.

2. The shunt regulator according to claim 1, wherein the second drive circuit comprises a second reference voltage circuit which outputs a second reference voltage and a second error amplifier.

3. The shunt regulator according to claim 2, wherein the activation control circuit comprises:
   a constant current circuit, having one terminal connected to the output terminal; and
   an NMOS transistor, having a drain connected to the other terminal of the constant current circuit, a gate connected to the first reference voltage circuit, and a source connected to the ground terminal.

4. The shunt regulator according to claim 1, wherein the activation control circuit comprises:
   a constant current circuit, having one terminal connected to the output terminal; and
   an NMOS transistor, having a drain connected to the other terminal of the constant current circuit, a gate connected to the first reference voltage circuit, and a source connected to the ground terminal.

5. The shunt regulator according to claim 1, wherein the second drive circuit comprises:
   a constant current circuit, having one terminal connected to the output terminal;
   an NMOS transistor, having a drain connected to the other terminal of the constant current circuit, a gate connected to the second output terminal of the voltage divider circuit, and a source connected to the ground terminal; and
   an inverting amplifier circuit, having an input terminal connected to the other terminal of the constant current circuit and a control terminal connected to a control terminal of the activation control circuit, and controlling the output transistor by an output voltage.

6. The shunt regulator according to claim 5, wherein the activation control circuit comprises:
   a constant current circuit, having one terminal connected to the output terminal; and
   an NMOS transistor, having a drain connected to the other terminal of the constant current circuit, a gate connected to the first reference voltage circuit, and a source connected to the ground terminal.

* * * * *